(12) United States Patent
Satoshi et al.

(10) Patent No.: US 7,467,635 B2
(45) Date of Patent: Dec. 23, 2008

(54) APPARATUS AND METHOD FOR SUBSTRATE PROCESSING

(75) Inventors: Joya Satoshi, Kawasaki (JP); Kazuyoshi Takeda, Kawasaki (JP); Tohru Watari, Yokohama (JP)

(73) Assignee: Sprout Co., Ltd., Kanagawa-Ken (JP)

( * ) Notice: Subject to any disclaimer, the term of this patent is extended or adjusted under 35 U.S.C. 154(b) by 705 days.

(21) Appl. No.: 10/842,826

(22) Filed: May 11, 2004

(65) Prior Publication Data

US 2004/0226582 A1  Nov. 18, 2004

(30) Foreign Application Priority Data

May 12, 2003 (JP) ............... 2003-133201
Mar. 11, 2004 (JP) ............... 2004-068854

(51) Int. Cl.
B08B 3/02 (2006.01)

(52) U.S. Cl. ............ 134/104.2; 118/52; 134/25.4; 134/33; 134/148; 134/183; 134/902

(58) Field of Classification Search ............ 118/52; 427/240; 134/25.4, 33, 148, 183, 902, 104.2
See application file for complete search history.

(56) References Cited

U.S. PATENT DOCUMENTS

| 4,903,717 | A | 2/1990 | Sumnitsch |
| 5,871,584 | A * | 2/1999 | Tateyama et al. ......... 118/323 |
| 6,589,338 | B1 * | 7/2003 | Nakamori et al. ......... 118/50 |
| 6,596,082 | B2 * | 7/2003 | Chuang et al. ......... 118/52 |
| 2001/0041229 | A1* | 11/2001 | Sakamoto et al. ......... 427/555 |
| 2004/0050491 | A1* | 3/2004 | Miya et al. ......... 156/345.11 |

FOREIGN PATENT DOCUMENTS

EP  1083589 A2 *  3/2001
JP  5-283395  10/1993

* cited by examiner

*Primary Examiner*—Frankie L. Stinson
*Assistant Examiner*—Samuel A Waldbaum
(74) *Attorney, Agent, or Firm*—Slater & Matsil, L.L.P.

(57) ABSTRACT

A substrate processing apparatus 10 includes a holding table 20 for rotatably holding a wafer W, a nozzle 40 for supplying chemical solutions L1 and L2 to the wafer W, at least one light irradiation units G1 and G2, and a pot 30 placed in the outer radius of the holding table 20 for collecting the processing solutions L1 and L2 that are scattered from the wafer W. The pot 30 also includes a cover 70 that can be moved in the direction of the axis of the holding table 20 so that a plurality of chemical solution collecting chambers M1 and M2 are formed in the pot by changing the position of the cover 70.

20 Claims, 7 Drawing Sheets

APPARATUS AND METHOD FOR SUBSTRATE PROCESSING

TECHNICAL FIELD

The present invention relates to a substrate processing apparatus, and particularly relates to collection and reuse of the processing solution in a substrate processing apparatus, which has the function of cleaning substrates such as semiconductor wafers.

BACKGROUND

With the recent market demands for higher performance semiconductor devices, reduced product cycle time, and cost reduction, circuits in semiconductor devices have become finer and more multi-layered, and the diameter of the wafers used in manufacturing processes has become larger. In addition, manufacturing paradigm has been shifted from mass production in one item to small production in diverse items. With these trends, the type of cleaning apparatus has been changing from conventional batch immersion type (hereafter called batch type) to single-wafer spin cleaning type (hereafter called single-wafer type). The batch type approach generally processes about 50 wafers sequentially between a plurality of chemical solution baths, while the single-wafer type approach cleans wafers one by one by holding a wafer, spinning it, and spraying chemical solution to both or any desired surfaces of the wafer.

The new cleaning method using the single-wafer type has advantages over the batch-type. Some advantages of various embodiments are: preventing cross contaminations between batches or in a batch, keeping a higher level of consistency across the wafer, being easily applicable to small volume production because it consumes less chemical solution per one process, and requiring smaller footprint per one apparatus. Because of these advantages, the transition to the single-wafer type has been accelerated.

However, the single-wafer type also has some drawbacks. One problem is that one process bath is shared by a plurality of chemical solution processings in order to minimize footprint, thus it is required to make the environment in the bath fully adequate for each processing. Particularly, the chemical solutions and rinsing water that are used for wafer processing should be separated, and thus the consumption of required utility and cleaning chemicals has been increasing in conventional technology. Especially, a considerable amount of exhaust utility or exhaust power is required. This is because it is known that the instability in the exhaust utility that is required for the apparatus leads to particle generation or watermark generation during wafer processing. Because of these problems being inferior to the batch type, an urgent improvement is required.

Although various approaches have appeared to solve the problems, there is no decisive solution so far. In particular, energy saving of utility is a critical issue to be solved in the view of global environmental protection and is an issue of primary importance to the single-wafer type cleaning apparatus. Therefore, the purpose of the present invention is to reduce the required utility while maintaining the advantages of the single-wafer type cleaning apparatus. The invention also provides a technology by which the amount of required chemical solution can be reduced.

In the single-wafer type, when cleaning is performed in one bath using various different chemicals, the bath is generally partitioned horizontally or vertically in order to avoid the chemicals from mixing with each other.

Figure 7A:
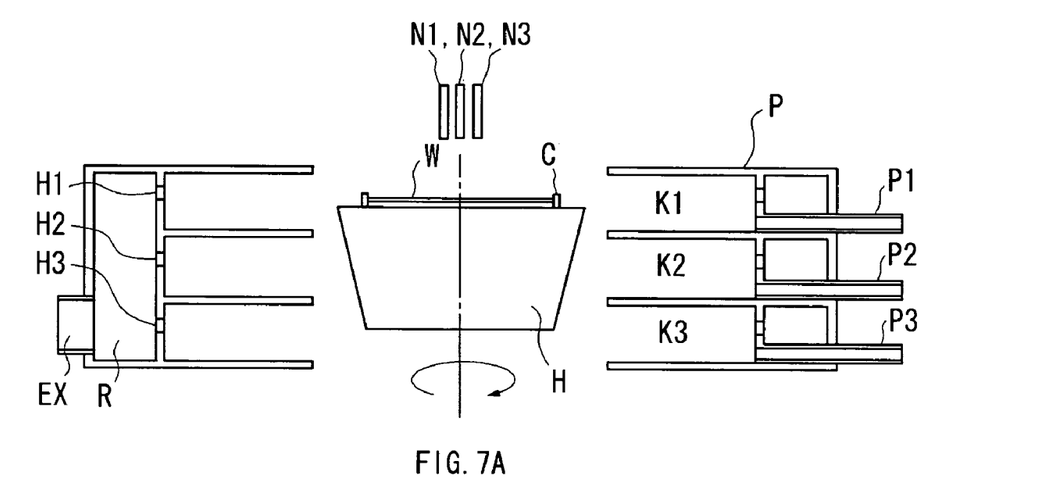
FIG. 7A is a cross sectional view showing an example of the configuration of a conventional cleaning apparatus (horizontally partitioned approach).

FIG. 7A shows an example of a partitioned approach. A similar technology is disclosed, for example, in the Japanese Patent Application Laid-Open No. 028395/1993. As shown in FIG. 7A, a pot P, which is capable of separate collection, comprises more than two portions called ring canals K1, K2, and K3, each of which has an opening toward the central space of the pot. When viewed from the holding table H of a wafer W, the openings are horizontally divided. In the center of the openings, the holding table H is placed for holding and rotating the wafer W with holding tools. The relative position of the holding table H and the pot P is variable. In the ring canals K1, K2, and K3, drainpipes P1, P2, and P3 are formed for conveying the solutions collected inside the pot P to outside. To maintain the ring canals K1, K2, and K3 under a negative pressure, a ring-shaped space R which is connected to the exhaust utility EX, is placed outer side of the ring canals and the ring-shaped space R is connected to the ring canals K1, K2, and K3 through a plurality of exhaust holes H1, H2, and H3 respectively.

When the wafer W held above the holding table H is processed with cleaning solutions L1, L2, and L3, the cleaning solutions L1, L2, and L3 are supplied from nozzles N1, N2, and N3 respectively and dispensed toward the wafer W. Cleaning solutions L1, L2, and L3 are separately collected into desired ring canals K1, K2, and K3 by relatively moving either of the holding table H or the pot P. In this example, the pot P is stationary, and the holding table H moves.

The holding table H that holds the wafer W moves at the height of the ring canal K1 and is rotated. When the cleaning solution L1 is sprayed toward the wafer W, due to the rotation of the holding table H, the cleaning solution L1 is scattered to the ring canal K1, collected therein, and drained through the drainpipe P1. Then, the holding table H moves at the height of the ring canal K2. When the cleaning solution L2 is sprayed toward the wafer W, due to the rotation of the holding table H, the cleaning solution L2 is scattered to the ring canal K2, collected therein, and drained through the drainpipe P2. After that, the holding table H moves at the height of the ring canal K3. When the cleaning solution L3 is sprayed toward the wafer W, due to the rotation of the holding table H, the cleaning solution L3 is scattered to the ring canal K3, collected therein, and drained through the drainpipe P3. As mentioned above, a plurality of chemical processes can be performed and each chemical solution can be collected separately. In addition, during the operation of these processes, the ring-shaped space R is kept under a negative pressure by the exhaust utility EX, and all ring canals K1, K2, and K3 are kept under a negative pressure through the exhaust holes H1, H2, and H3.

Figure 7B:
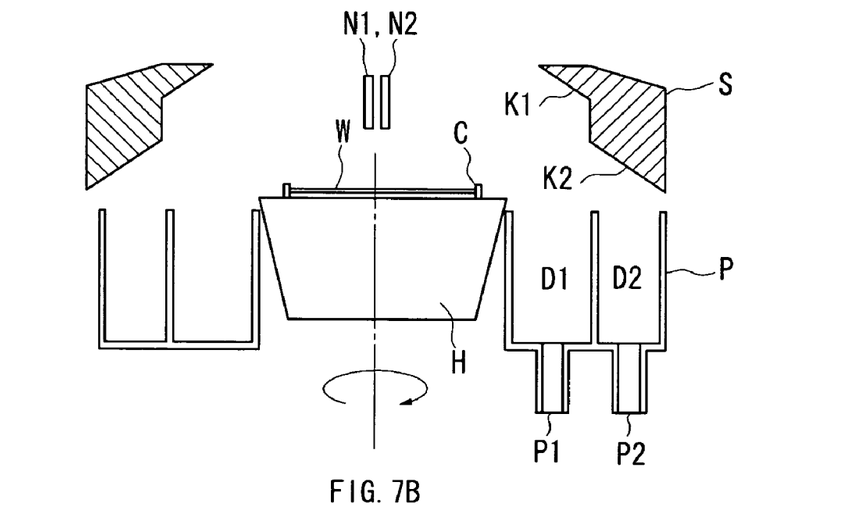
FIG. 7B is a cross sectional view showing an example of the configuration of a conventional cleaning apparatus (vertically partitioned approach).

With reference to FIG. 7B, a vertically partitioned approach is described in which the ring canals K1 and K2 are concentrically placed. A shield plate S moves relatively to the pot P with the purpose of changing the flow of the solution droplets and gas, which are scattered in the direction of the radius of the holding table H due to its rotation, to the direction of the rotation axis.

When the chemical solution L1 is sprayed from the nozzle N1, the shield plate S moves beforehand so that the ring canal K1 is placed on a level plane with the wafer W, changes the direction of the scattered chemical solution L1 and airflow, and conveys them into the drain D1. Then, when the chemical solution L2 is sprayed from the nozzle N2, the shield plate S moves beforehand so that the ring canal K2 is placed on a level plane with the wafer W, changes the direction of the scattered chemical solution L2 and airflow, and conveys them into the drain D2. As mentioned above, the chemical solutions L1 and L2 and the airflow caused due to the rotation of the holding table H are collected into the drains D1 and D2 respectively, and drained out of the pot P through the exhaust pipes P1 and P2. At this time, solution component and gas component are drained out together.

Depending on the conditions during the wafer processing, the rotational speed of the holding table H may be high. In such a case, the airflow caused due to the rotation becomes larger and solution droplets are scattered more widely, therefore, it is required to capture and collect them with the process chamber or pot having a larger diameter. In contrast, in the case the rotational speed is low, the airflow caused due to the rotation becomes smaller and solution droplets are not scattered widely, therefore, it is better collect them with the process chamber or pot having a smaller diameter. Considering these facts, the vertically partitioned type seems to be more appropriate.

However, the collection of processing solution in the above mentioned conventional processing apparatus has challenges as follows. In the horizontally partitioned approach shown in FIG. 7A, all the ring canals K1, K2, and K3 are always opened. Therefore, there is a high probability that when a process is performed using one of the ring canals, the chemical atmosphere of the ring canal is taken in through the openings of other ring canals. Because the wafer holding table H is rotated at a high speed in the center, a negative pressure is caused inside. Therefore, it is conceivable that there is a strong tendency for the chemical atmosphere to be taken in through the ring canals, which are not used for the process. This degrades the purity of the collected chemical solution and results in unevenness of chemical process and/or watermarks on the wafer. To avoid them, it is necessary to keep the ring canals under suction by a large amount of drawing air, which requires a large amount of exhaust utility. As a result, the apparatus itself becomes large and the cost for processing is increased.

In the case of the vertically partitioned approach shown in FIG. 7B, the drains D1 and D2 collect the chemical solutions L1 and L2 respectively, however, they also collect gas components, which are brought by the holding table H. Therefore, the drainpipes P1 and P2 should be connected to the exhaust utility EX. In collecting the chemical solution L2, the gas, which is brought concurrently with the chemical solution L2, flows through the space in which the drain D1 is opened. To avoid contamination therein, it is necessary that the holding table H should be rotated at a higher speed to fully scatter the solution droplets of the chemical solution L2. Accordingly, the ring-shaped opening K2 and drain D2 should have enough space to receive the airflow caused by the higher speed rotation and thus it is necessary to use the pot P having a larger diameter. Also required is the exhaust utility to keep the space under a negative pressure. In addition, it is quite conceivable that the steam of the chemical solution L1 from the drain D1 may concurrently flow out. To avoid it, it is necessary to prevent the stagnation or backflow of the chemical solution L1 by using a large amount of exhaust gas. Therefore, the exhaust utility should be increased and thus there exists the problems of upsizing apparatus and greater cost, as in the horizontally partitioned approach.

SUMMARY OF THE INVENTION

In one aspect, the invention solves the problems in the above-mentioned conventional technology and provides an apparatus and a method for processing a substrate, which are capable of separately collecting the processing solutions that are supplied toward the substrate and effectively utilizing the exhaust utility. In addition, aspects of the invention improve the conventional substrate processing apparatus and provide an apparatus and a method for economically processing a substrate, which has an excellent capability in separately collecting the processing solutions.

A substrate processing apparatus, according to the present invention, comprises a holding table for rotatably holding a substrate, a supply portion for supplying processing solutions to above the substrate, a pot being placed in the outer radius of the holding table for collecting the processing solutions scattered from the substrate, and at least one light irradiation unit for irradiating the substrate with light. The pot comprises at least one divider element, which can be moved in the direction of the axis of said holding table. By changing the position of at least one divider element, spaces for collecting a plurality of processing solutions can be formed in the pot. With these means, the plurality of processing solutions that are used for processing the substrate can be separately collected and by reusing the collected processing solutions, the substrate processing at a lower cost can be performed. In addition, it is possible to provide a substrate processing apparatus that can contribute to environment protection because the processing solutions that are drained out of the substrate processing apparatus can be reduced. Moreover, by irradiating the substrate with light from the light irradiation unit, it is possible to concurrently perform drying of the substrate surface or decomposition of organics.

Preferably, when the divider element is placed in a first position, an opening is formed in the space for collecting the first processing solution and the opening in the space for collecting the second processing solution is closed. Then, when the divider element is placed at a second position, the opening in the space for collecting the first processing solution is closed and an opening is formed in the space for collecting the second processing solution. As such, when the opening of one of the spaces for collecting processing solutions is formed, the opening of the other space for collecting processing solutions is closed. Thereby the space for collecting processing solutions in the pot is reduced and thus the capability of the exhaust utility can be fully utilized. In short, it is possible to downsize the exhaust utility comparing to conventional technology. In addition, contamination from other processing solutions or their atmosphere can be prevented because the opening of the space for collecting the first or second processing solutions is closed when it does not collect processing solutions.

When the openings of the spaces for collecting the first or second processing solutions are formed, the first or second processing solutions that are used for processing the substrate are collected through the openings. The substrate processing apparatus further comprises a drainpipe connected to the pot and a gas-solution separation portion, wherein the gas-solution separation portion is preferably connected to the exhaust utility. In addition, the space for collecting the first processing solution may be formed at the inner radius with respect to the space for collecting the second processing solution. First and second drainpipes may be connected respectively to the spaces for collecting the first or second processing solutions and the gas-solution separation portion may be connected to the second drainpipe. Moreover, light irradiation units can be placed both above and below the holding table. The light irradiation units irradiate the substrate with ultraviolet rays or infrared rays, for example.

Another substrate processing apparatus, according to the present invention comprises the functions of supplying processing solutions to the rotatably held substrate and collecting the processing solution that is scattered from the substrate into a pot. At least above or below the holding table, a light irradiation unit is placed. The pot is placed in the outer radius of the holding table and a plurality of processing solution collecting chambers are formed in the pot for separately collecting the processing solutions. Each of the plurality of processing solution collecting chambers is isolated from each other by changing the position of a movably provided divider element.

Preferably, when the divider element is placed in a first position, an opening is formed in the space for collecting the first processing solution in the pot (ready for use condition) and the opening in the space for collecting the second processing solution is closed (non-use condition). Then, when the divider element is placed at a second position, the opening in the space for collecting the first processing solution in the pot is closed (non-use condition) and an opening is formed in the space for collecting the second processing solution (ready for use condition).

In addition, the spaces for collecting the first or second processing solutions are placed concentrically with the holding table. The holding table rotatably holds the substrate approximately horizontal. The divider element comprises a first portion that is extending in the direction nearly horizontal and a second portion that is angled from the first portion. When the divider element is placed in the first position, the first portion and a first surface of the second portion form a part of the first processing solution collecting chamber. When the divider element is placed in the second position, the first portion and a second surface of the second portion, which opposes to the first surface, form a part of the second processing solution collecting chamber. The first surface of the divider element is used to convey the first processing solution into the first processing solution collecting chamber, and the second surface of the divider element is used to convey the second processing solution into the second processing solution collecting chamber, thereby the contamination of the first and second processing solutions with the other processing solutions can be avoided.

The substrate processing apparatus further comprises a nozzle that is capable of dispensing a plurality of processing solutions to the substrate above the holding table. When the first processing solution is dispensed from the nozzle, the first processing solution is collected into the first processing solution collecting chamber. And when the second processing solution is dispensed from the nozzle, the second processing solution is collected into the second processing solution collecting chamber. Preferably, the first and second processing solution collecting chambers are kept under a negative pressure. Because the space of the processing solution collecting chamber in the non-use condition is closed by the divider element, the space to be kept under a negative pressure is smaller than conventional technology and therefore the capability of the exhaust utility can be reduced. Alternatively, by using the exhaust utility with the same capability as the conventional, the negative pressure in the pot can be greater and therefore the reduction of particles or watermarks on the wafer can be enhanced.

A substrate processing method, according to the present invention, comprises the following steps in a substrate processing apparatus, wherein the substrate processing apparatus comprises a holding table for rotatably holding a substrate, and a pot placed in the outer radius of the holding table for collecting the processing solutions that are used for processing the substrate.

The method comprises the step of forming a space for collecting the first processing solution in the pot by moving a divider element in the pot to a first position, wherein the space accommodates the first processing solution that is supplied to the substrate, the step of supplying the first processing solution to above the substrate and collecting the first processing solution that is scattered from the substrate in the space for collecting first processing solution, and the step of irradiating at least one of the surfaces of the substrate with first light.

Preferably, when the divider element is placed in the first position, the opening in the space for collecting second processing solution in the pot is closed. The substrate processing method further comprises the step of forming a space for collecting second processing solution in the pot by moving the divider element to a second position, wherein the space accommodates the second processing solution that is supplied to the substrate, the step of collecting the second processing solution in the space for collecting second processing solution, and the step of irradiating at least one of the surfaces of the substrate with second light. Preferably, the first and second lights are either of ultraviolet rays or infrared rays. By irradiating with infrared rays, the substrate can be dried. By irradiating with ultraviolet rays, the decomposition of organics can be performed. Spaces for collecting first and second processing solutions are kept under a negative pressure. At this time, the opening of the space for collecting first or second processing solutions is closed when it does not collect a processing solution, thereby the contamination from other processing solutions or their atmosphere can be avoided.

In a substrate processing apparatus, according to the present invention, a plurality of processing solution collecting chambers or spaces are formed by moving a divider element (cover), which is placed in the pot, thereby a plurality of processing solutions can be effectively collected and reused. In addition, by closing the chambers or spaces when they do not collect processing solutions, the space that requires the exhaust utility can be reduced and thereby the exhaust efficiency can be improved compared to the conventional. Hereby the processing solutions and/or their steam or atmosphere in the pot can be effectively kept under suction and thus particles or watermarks on the wafer can be reduced without increasing the capability of the exhaust utility. Moreover, by using a smaller exhaust utility, the entire processing apparatus can be downsized. In addition, the light irradiation units enable light irradiation to the substrate and thereby the decomposition of organics or the drying of moisture on the substrate, for example, can be concurrently performed.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

Figure 1A:
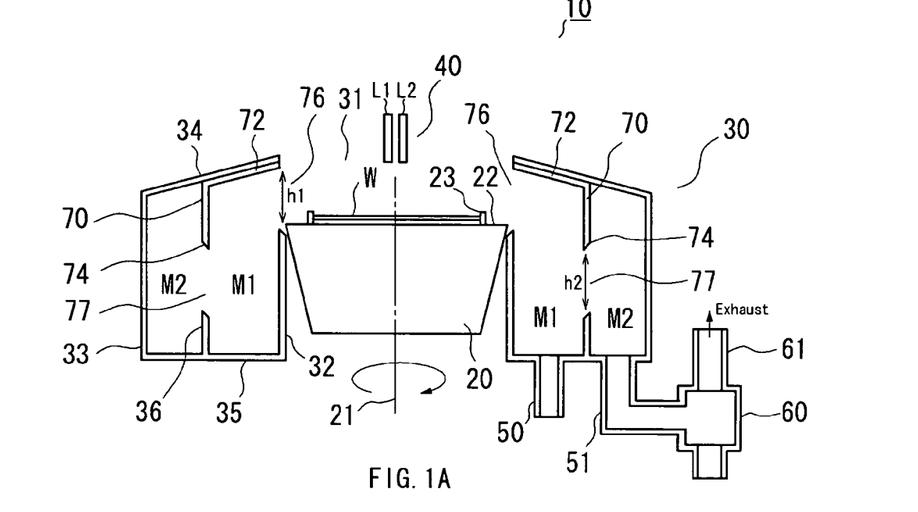
FIGS. 1A and 1B are cross sectional views showing the configuration of a cleaning apparatus according to the first embodiment of the present invention.
Figure 1B:
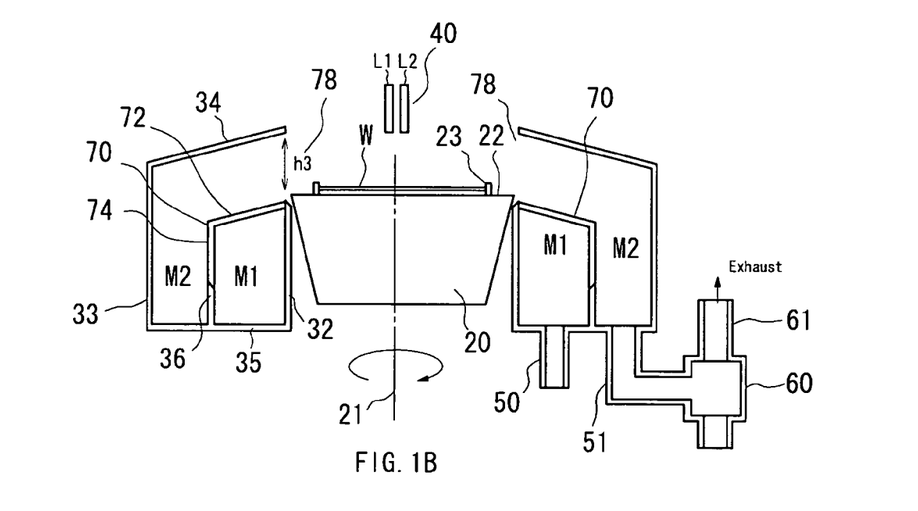

Referring to the attached drawings, embodiments of the present invention are now described in detail. FIGS. 1A and 1B are cross sectional views showing the configuration of a substrate processing apparatus according to an embodiment of the present invention. In FIGS. 1A and 1B, a substrate cleaning apparatus 10 comprises a holding table 20 for horizontally and rotatably holding a semiconductor wafer W, a pot 30 placed in the outer radius of the holding table 20, a nozzle 40 placed above the holding table 20 for dispensing a plurality of processing solutions to above the wafer, drainpipes 50 and 51 connected to the bottom of the pot 30, and a gas-solution separation box 60 connected to the drainpipe 51.

The holding table 20 is rotated via a rotation axis 21 by a rotation driving unit (not shown). The holding table 20 comprises a round-shape holding plane 22 thereon. On the holding plane 22, holding tools 23 are formed for holding the wafer W. The wafer W is held above the holding plane 22 with the holding tools 23 nearly horizontally in a non-contact manner by using the Bernoulli Effect, preferably by using the inert gas supplied from the holding plane 22.

The pot 30 has a doughnut-shape in the center of which an opening 31 is formed. The pot 30 comprises a ring-shaped inner circumference plate 32, a ring-shaped outer circumference plate 33, a top plate 34, and a bottom plate 35 which couple the inner circumference plate 32 and the outer circumference plate 33, and a divider plate 36 extending from the bottom plate 35 to a predetermined height. The top plate 34 is tilted upward in an inward direction from the outer circumference plate 33 and a round-shaped opening 31 is formed in the center of the top plate 34. The diameter of the opening 31 is nearly same as that of the holding plane 22 of the holding table 20.

The pot 30 is placed in the outer radius of the holding table 20. At this time, the tip of the inner circumference plate 32 is at the nearly same height of the holding plane 22 of the holding table 20. In the pot 30, a ring-shaped cover (divider element) 70 is provided for forming chemical solution collecting chambers M1 and M2 for collecting chemical solutions. The cover 70 comprises an opening switch portion 72, which extends nearly horizontally with a similar angle to the angle of the top plate 34 of the pot 30, and a connection tip 74 which is connected to the opening switch portion 72, and extends nearly perpendicularly from the opening switch portion 72. The cover 70 can be moved in the pot 30 in the perpendicular direction, that is, the direction of the rotation axis 21 of the holding table 20, by a driving unit (not shown).

As shown in FIG. 1A, when the cover 70 is moved upward and the opening switch portion 72 abuts on the top plate 34 of the pot 30, the chemical solution collecting chamber M1 is formed in the space close to the holding table 20 in the pot 30. The chemical solution collecting chamber M1 is a space surrounded by the surface of the cover 70, the divider plate 36, the bottom plate 35, and the inner circumference plate 32. In the space, a ring-shaped opening 76, having a predetermined height hi above the holding table 20, is formed. In addition, because the connection tip 74 is spaced apart from the divider plate 36, an opening 77 with a height h2 is formed therein.

As shown in FIG. 1B, when the cover 70 is moved downward and the connection tip 74 abuts on the divider plate 36, the chemical solution collecting chamber M2 becomes active (ready for use condition) and the chemical solution collecting chamber M1 becomes inactive (non-use condition). In other words, by moving the opening switch portion 72 of the cover 70 away from the top plate 34 until it abuts on the tip of the inner circumference plate 32 and by connecting the connection tip 74 to the divider plate 36, the chemical solution collecting chamber M1 is closed by the cover 70. In the chemical solution collecting chamber M2, a ring-shaped opening 78, having a height h3 above the holding plane of the holding table 20, is formed. M2 is a space surrounded by the lower surface of the cover 70, the top plate 34, the outer circumference plate 33, the bottom plate 35, and the divider plate 36.

Above the holding table 20, a nozzle 40 is placed. The nozzle 40 is capable of dispensing chemical solutions L1 and L2 to above the wafer W depending on the processing of the wafer W. In addition, at the bottom of the pot 30, drainpipes 50 and 51 are provided. The drainpipe 50 is connected to the chemical solution collecting chamber M1 and the drainpipe 51 is connected to the chemical solution collecting chamber M2. The drainpipe 51 is further connected to a gas-solution separation box 60 for separating gas from solution. The gas-solution separation box 60 is connected the exhaust utility EX (not shown) through a gas exhaust pipe 61. The exhaust utility EX draws gas component through the gas exhaust pipe 61 and draws the steam or atmosphere of the collected chemical solution in the gas-solution separation box 60 and concurrently keeps the inside of the pot 30 under a negative pressure. On the other hand, solution components are collected through the drainpipes 50 and 51 respectively and these solutions are processed for reuse in a reuse processing unit (not shown).

Now, operations are described. In the cleaning apparatus, the wafer W held by the holding table 20 is rotated at a predetermined speed. Then chemical solution L1 is dispensed from the nozzle 40 to above the wafer W for processing the wafer W with the chemical solution. At this time, as shown in FIG. 1A, the opening switch portion 72 of the cover 70 abuts on the top plate 34, thereby the ring-shaped opening 76 is formed between the holding table 20 and the opening switch portion 72. The chemical solution collecting chamber M1 is formed in the outer radius of the holding table 20. The connection tip 74 of the cover 70 is placed at the position lower than the holding plane 22 of the holding table 20 and guides the gas and solution that are scattered from the surface of the wafer W toward the bottom of the chemical solution collecting chamber M1. As mentioned above, the chemical solution L1, which is used for processing the wafer W, is collected in the chemical solution collecting chamber M1 and then collected through the drainpipe 50. In addition, because the chemical solution collecting chamber M1 is connected to the chemical solution collecting chamber M2 through the opening 77, the steam and atmosphere of the chemical solution L1 are drawn through the gas-solution separation box 60 and the gas exhaust pipe 61. Concurrently, the opening 76 in the chemical solution collecting chamber M1 becomes negative pressure, thereby, the backflow of the steam and atmosphere of the chemical solution L1 through the ring-shaped opening 76 back to the wafer W above the holding table 20 is prevented.

Then, the chemical processing with the chemical solution L2 is now described. The cover 70 is lowered so that the connection tip 74 abuts on the divider plate 36 and the opening switch portion 72 abuts on the tip of the inner circumference plate 32, thus the chemical solution collecting chamber M1 is closed. The opening 78 is formed between the opening switch portion 72 of the cover 70 and top plate 34 of the pot 30. Then the chemical solution L2 is dispensed from the nozzle 40 toward the rotated wafer W. With these means, the chemical solution L2 scattered from the wafer W is collected into the chemical solution collecting chamber M2. The collected chemical solution flows through the drainpipe 51, and then gas and solution are separated in the gas-solution separation box 60. The solution is collected through the drainpipe 51, while the gas is drawn out through the gas exhaust pipe 61 due to the suction by the exhaust utility EX. The opening 78 of the chemical solution collecting chamber M2 is evacuated by the exhaust utility, thus it is kept under a negative pressure. Thereby the backflow of the steam and atmosphere of the chemical solution L2 through the ring-shaped opening 78 back to the wafer W, and above the holding table 20 is prevented.

In the cleaning apparatus according to the present embodiment, the chemical solution collecting chamber M1, which is dedicated for solution, is placed inner side of the pot 30 and the chemical solution collecting chamber M2, which drains out gas and solution concurrently, is placed outer side of the pot 30. By providing the cover 70 over the inner chemical solution collecting chamber M1, it is possible to provide exhaust pressure on a desired chemical solution collecting chambers M1 or M2 and thus eliminate waste of the exhaust pressure. In addition, the chemical solution L1 collected in the chemical solution collecting chamber M1 is kept inside the chamber by the cover 70, therefore, the power to draw the chemical solution L1 is not required. Moreover, each of the chemical solutions L1 and L2 contacts upper or lower surfaces of the cover 70 which are isolated each other, therefore, the chemical solutions L1 and L2 do not mix together. As mentioned above, according to the present embodiment, the chemical solutions L1 and L2 are effectively separated and collected.

Next, the second embodiment of the present invention is described. In the first embodiment, one cover 70 is used to form two chemical solution collecting chambers, M1 and M2, in the pot 30 and two kinds of chemical solutions L1 and L2 are separately collected. However, it is possible to separately collect more than three kinds of chemical solutions by using a plurality of covers 70 to form more chemical solution collecting chambers.

Figure 2A:
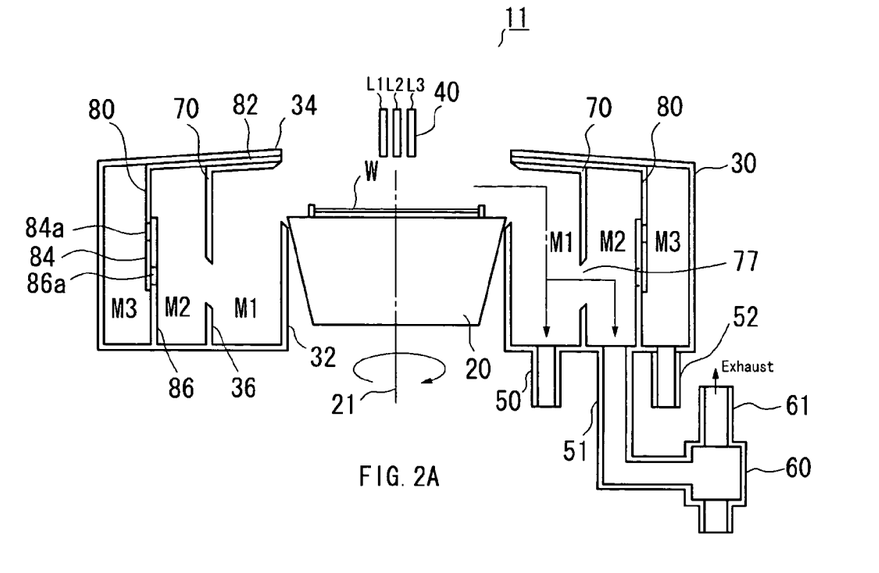
FIGS. 2A and 2B are cross sectional views showing the configuration of a cleaning apparatus according to the second embodiment of the present invention.
Figure 2B:
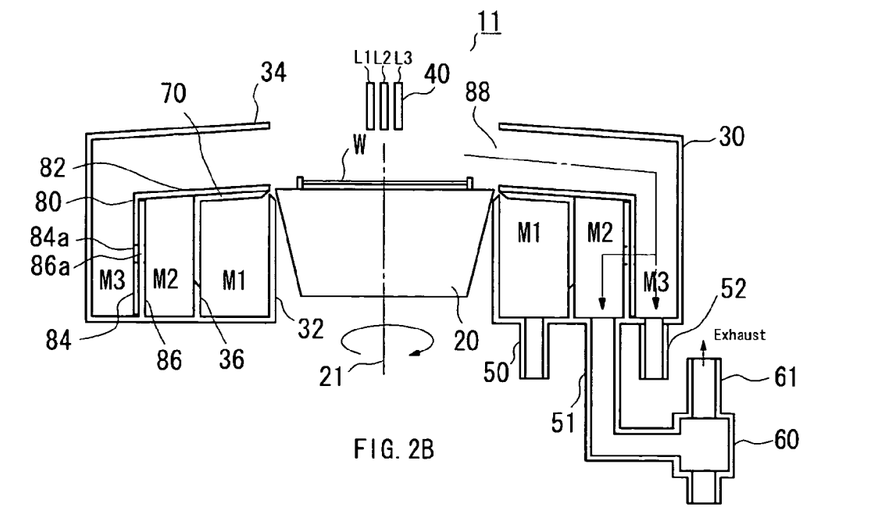

FIGS. 2A and 2B show the configuration of a cleaning apparatus 11 according to the second embodiment. In FIGS. 2A and 2B, like reference numerals are used to refer to like elements in FIG. 1. In the pot 30, a second cover 80 is provided adding to the cover 70 in the first embodiment. The cover 70 forms chemical solution collecting chambers M1 and M2 in the pot 30 for separately collecting the chemical solutions L1 and L2, as previously mentioned, while the second cover 80 forms a chemical solution collecting chamber M3 for separately collecting the chemical solution L3. A through hole 84a is formed at the connection tip 84 of the cover 80 and a divider plate 86, being in contact with the connection tip 84, is formed on the bottom plate of the pot 30, and a through hole 86a is formed in the divider plate 86.

In the state shown in FIG. 2A, the opening switch portions 72 and 82 of the covers 70 and 80 respectively abut the top plate 34 of the pot 30 and the chemical solution collecting chamber M1 is in the active condition. The chemical solution L1 scattered from the wafer W is collected through the drainpipe 50 and, concurrently, gas component is drawn through the opening 77 by the exhaust utility EX. At this time, the through hole 84a at the connection tip 84 of the cover 80 is placed in a different position with the position of the through hole 86a of the divider plate 86 and thus the chemical solution collecting chamber M3 is closed by the cover 80.

In the state shown in FIG. 2B, the covers 70 and 80 are lowered, their opening switch portions 72 and 82 are placed at the tip of the inner circumference plate 32 in the pot 30, the connection tip 74 of the cover 70 abuts on the divider plate 36, and the chemical solution collecting chambers M1 and M2 are closed by the covers 70 and 80. At this time, the position of the through hole 84a, at the connection tip 84 of the cover 80, coincides with the position of the through hole 86a of the divider plate 86. Thereby, the chemical solution collecting chamber M3 becomes active and the chemical solution L3 dispensed from the nozzle 40 and scattered from surface of the wafer W is collected into the collecting chamber M3. Solution is drained through the drainpipe 52 and gas flows through the through holes 86a and 84a and is drawn out through the gas exhaust pipe 61. Concurrently, the opening 88 of the chemical solution collecting chamber M3 is kept under a negative pressure via the through holes 86a and 84a so that the backflow of the steam or atmosphere of the chemical solution L3 back to the wafer W is prevented.

Figure 3:
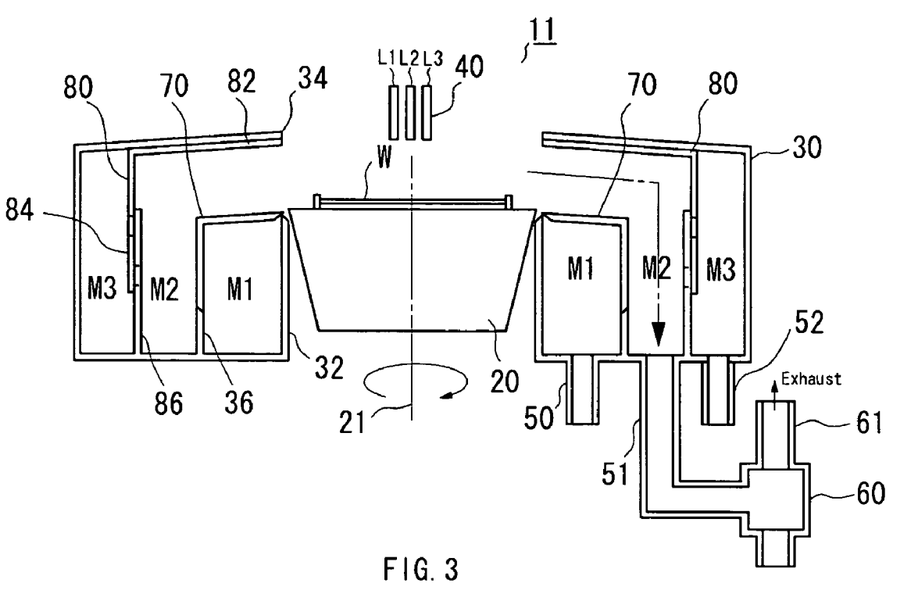
FIG. 3 is a cross sectional view showing the configuration of a cleaning apparatus according to the second embodiment of the present invention.

In the state shown in FIG. 3, the cover 80 abuts on the top plate 34 of the pot 30, and the cover 70 is lowered, and the chemical solution collecting chambers M1 is closed. In this example, as in FIG. 1B, the chemical solution L2, supplied from the nozzle 40, is separately collected into the chemical solution collecting chamber M2.

Figure 4:
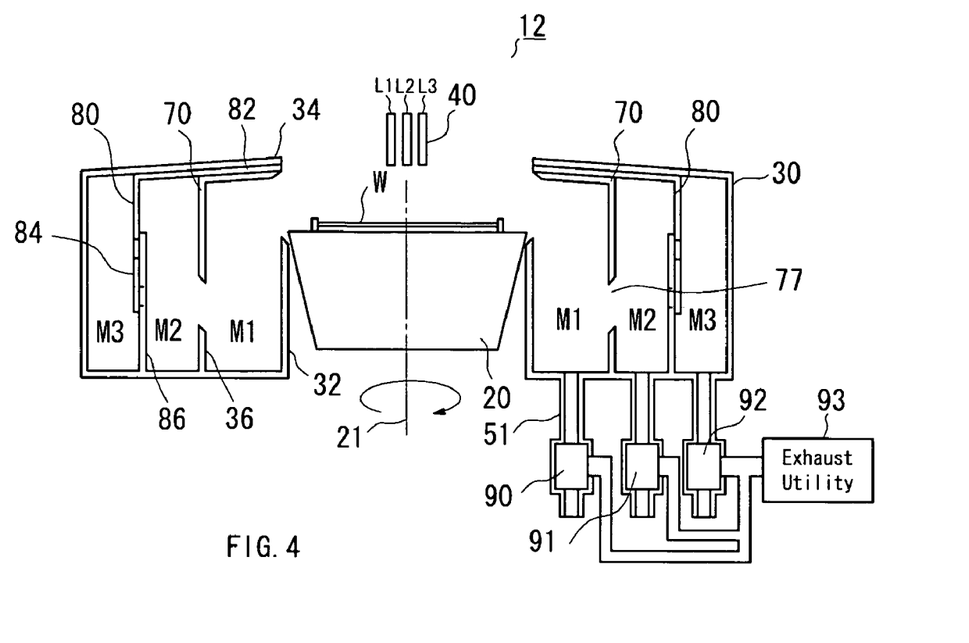
FIG. 4 is a cross sectional view showing the configuration of a cleaning apparatus according to the third embodiment of the present invention.

Now, the third embodiment of the present invention is described. FIG. 4 is a cross sectional view showing the configuration of a cleaning apparatus 12, according to the third embodiment. In the third embodiment, gas-solution separation boxes 90, 91, and 92 are connected respectively to the chemical solution collecting chambers M1, M2, and M3 in the pot 30. The gas separated in the boxes is drawn by the exhaust pressure of the exhaust utility EX 93. In the second embodiment, the gas-solution separation is performed inside the pot 30, therefore, the exhaust pressure of the exhaust utility being connected to the chemical solution collecting chamber M2 is used in collecting the chemical solutions into the chemical solution collecting chambers M1 and M3. In the third embodiment, the gas-solution separation is performed outside the pot 30.

Figure 5A:
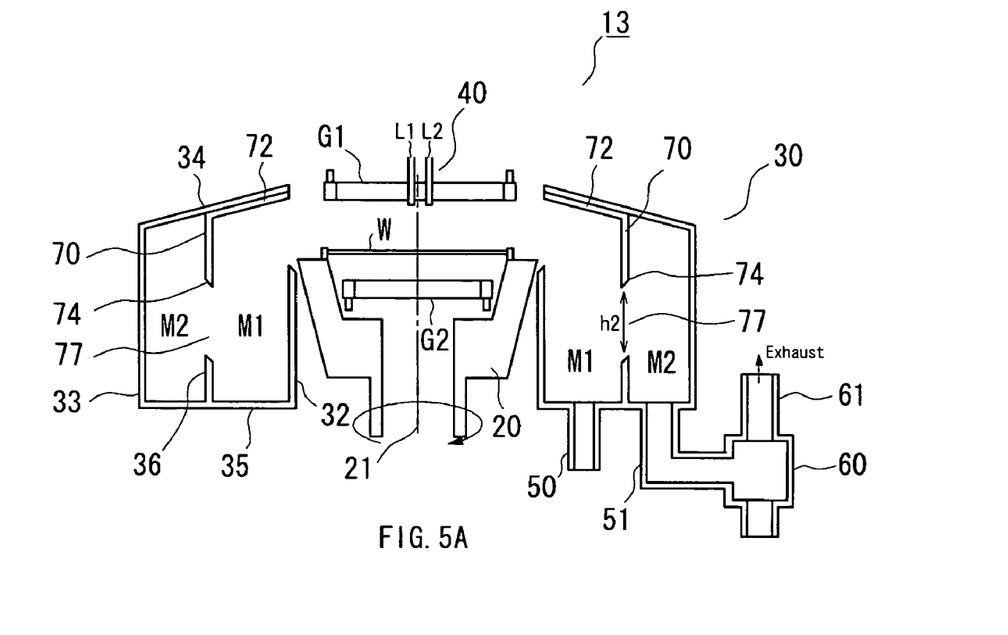
FIGS. 5A and 5B are cross sectional views showing the configuration of a cleaning apparatus according to the fourth embodiment of the present invention.

Here, exhaust pressure and the bore diameter, which are required to keep the size of the watermarks or particles on the wafer W as small as conventional technology, are compared between the conventional technology (the configuration shown in FIG. 5A and the cleaning apparatus according to the first embodiment.

TABLE 1

| | conventional technology | first embodiment |
|---|---|---|
| exhaust pressure | 240 Pa | 200 Pa |
| bore diameter | 150 Å | 100 Å |

From these data, the flow rates required for the exhaust utility are compared.

$$\frac{\text{flow rate of first embodiment}}{\text{flow rate of conventional technology}} = \text{Equation 1}$$

$$\frac{\{99.8^2/(100000-200)\}}{\{145.8^2/(100000-240)\}} = 46.8\%$$

The result shows that the cleaning apparatus of the first embodiment can reduce the required exhaust utility to the 46.8% of that of the conventional technology and it is obvious that a sufficient effect is obtained.

Next, the result of the improvement in the efficiency of the separate collection by the cleaning apparatus of the first embodiment is shown. A series of processes including HF processing, rinsing, and drying are performed for 50 wafers by using 0.5 wt % HF for the chemical solution L1 and pure water for chemical solution L2 as rinsing water. The chemical solutions L1 and L2, which are supplied from tanks, are sprayed to the wafer W through the nozzle 40. The chemical solutions L1 and L2, which are scattered, are collected into the chemical solution collecting chambers M1 and M2, returned to the tanks, and repeatedly reused. The capability of the separate collection is determined by measuring the HF concentration of the chemical solution L1 and the decrease thereof. The concentration of the chemical solution L1 in the supplying line is measured by using an inline concentration meter. The amount of the usage of the chemical solution L1 is measured by the amount of the decrease of the liquid level in the tank.

TABLE 2

|  | conventional technology | first embodiment |
| --- | --- | --- |
| decrease in concentration | 20% of the concentration decreased | No decrease |
| amount of the chemical solution used per 1 wafer | 200 cc | 40 cc |

As can be seen in Table 2, it should be understood that the capability of the separate collection of the cleaning apparatus according to the present embodiment is improved over the conventional technology.

Next, the watermarks and particles on the processed wafer are counted with a particle counter.

TABLE 3

|  | conventional technology | first embodiment |
| --- | --- | --- |
| size of the particles | larger than 0.15 μm | larger than 0.15 μm |
| number of the particles | more than 30 | less than 10 |

As can be seen in Table 3, the number of the particles is significantly reduced. Thus it should be understood that the efficiency of the exhaust utility is superior to the conventional technology.

As previously described, according to the present embodiments, the exhaust utility can be significantly reduced. By concurrently using the system of collecting chemical solutions and the system of reusing them, it is possible to significantly reduce the amount of chemical solutions in cleaning per one wafer, which are otherwise wasted. Because the reduction of the required utility, the reduction of chemical solutions to be used, and the separate collection/reuse of the chemical solutions are ensured, the semiconductor cleaning apparatus, using the technology of the present invention, can significantly contribute to global environmental protection.

Figure 5B:
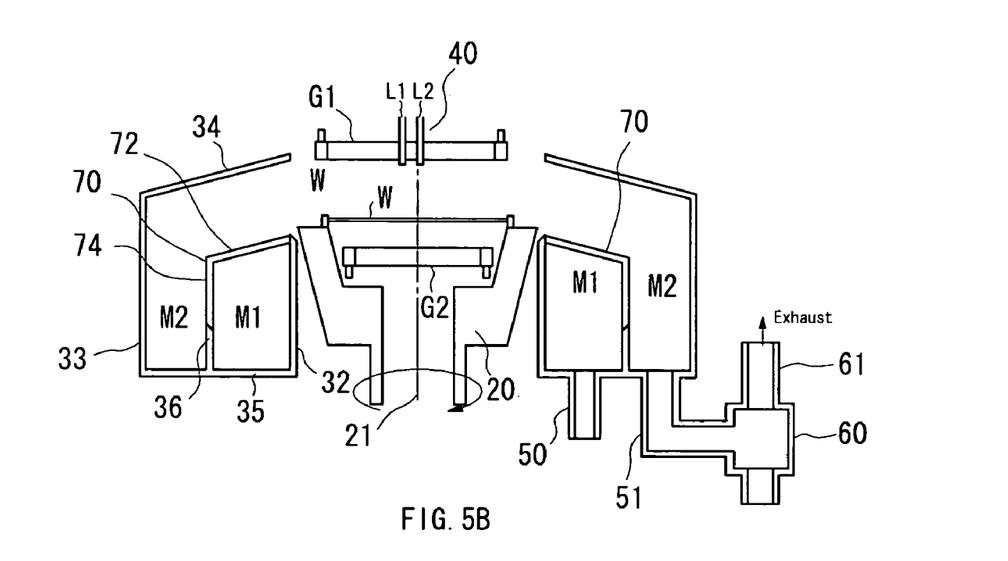

Now, the fourth embodiment of the present invention is described. A cleaning apparatus 13 according to the fourth embodiment has the configuration in which a light irradiation capability is added to the cleaning apparatus of the previously mentioned first embodiment. In performing a series of processes of the wafer W, such as HF processing, rinsing, and drying, by the cleaning apparatus as previously mentioned, by utilizing the light irradiation capability, the drying of moisture and the decomposition of organics on the wafer can be concurrently performed.

As shown in FIG. 5A, an upper light irradiation unit G1 can be placed above the holding table and a lower light irradiation unit G2 can be placed in the holding table 20. Preferably, the nozzle 40 can be integrally connected to the upper light irradiation unit G1, and in that case, the nozzle 40 is mounted approximately at the center of the unit G1. Then the lower light irradiation unit G2 is preferably placed in an inner space being formed in the holding table 20 and is at a standstill in the inner space when the holding table 20 is rotated. The upper light irradiation unit G1 and the lower light irradiation unit G2 are placed close to the wafer W and irradiate the upper and lower surfaces of the wafer W with light at an approximately constant intensity, preferably.

For the light irradiation units G1 and G2, lamps (e.g. mercury lamps), which apply ultraviolet rays, for example, can be used. By irradiating the wafer W with ultraviolet rays from the light irradiation units G1 and G2 in rinsing the wafer W, the organics remaining on the surfaces of wafer W can be decomposed. In this case, the wafer W can be either rotated or stopped. For example, a trace of remaining resist, organic chemical solutions, and slightly remaining organic matters can be suitably decomposed with the ultraviolet rays. By irradiating with ultraviolet rays from both of the light irradiation units G1 and G2, both upper and lower surfaces of the wafer W can be concurrently performed.

Other than ultraviolet lamps, lamps which apply infrared rays can be used for the light irradiation units G1 and G2. In this case, the wafer W can be either rotated or stopped. In drying process of the wafer W, for example, by irradiating the wafer W with infrared rays from the light irradiation units G1 and G2, the vaporization of moisture remaining on the surfaces of the wafer W can be enhanced. This effectively prevents the generation of watermarks due to the moisture remaining in finely patterned areas.

Figure 6:
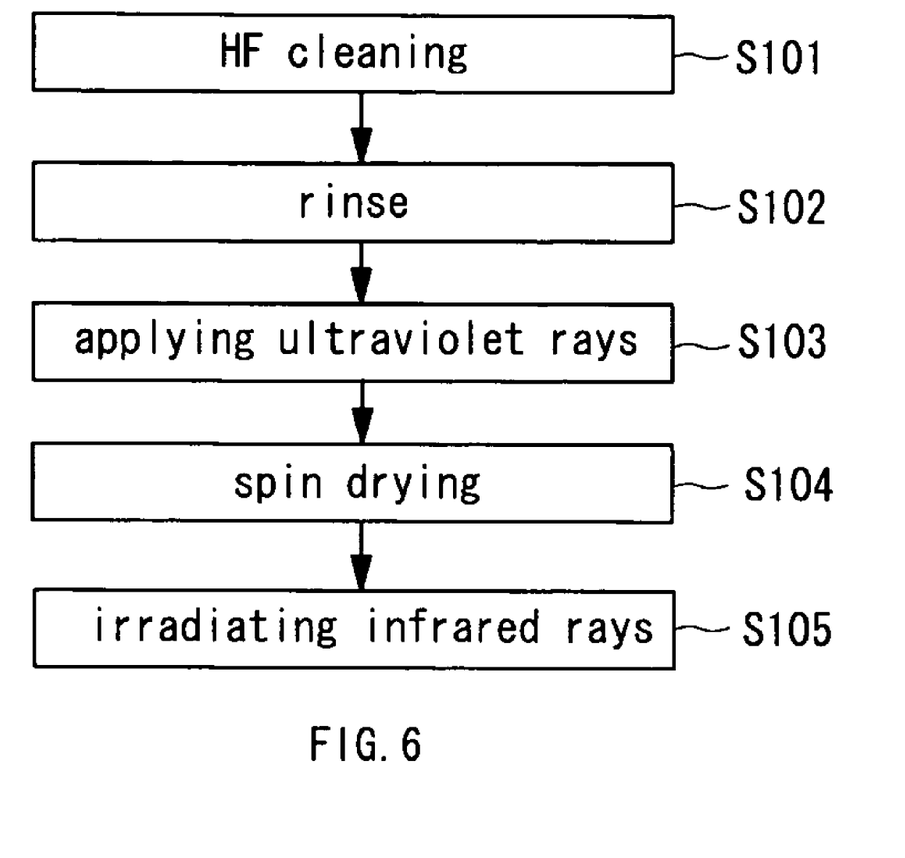
FIG. 6 is a flowchart showing an example of a processing flow by the cleaning apparatus according to the fourth embodiment.

FIG. 6 is a flowchart showing an example of the processing of the wafer W by using the cleaning apparatus 13 in FIG. 5. In this example, light irradiation units G1 and G2 have a combination of a lamp for ultraviolet irradiation and a lamp for infrared irradiation and switch the driving of the ultraviolet lamp and the infrared lamp depending on each process.

The HF cleaning of the wafer W is performed by spraying HF chemical solution L1 from the nozzle 40 (step S101). Then, the rinsing of the wafer W is performed by spraying pure water L2 from the nozzle (step S102). Concurrently with the pure water spraying, by applying ultraviolet rays from the light irradiation units G1 and G2, organic matters or the like on both surfaces of the wafer W are decomposed (step S103). Then, by stopping the spraying of pure water from the nozzle 40, the spin-drying of the wafer W is performed at room temperature or an elevated temperature (step S104). Concurrently with the spin-drying, by irradiating the wafer W with infrared rays from the light irradiation units G1 and G2, the drying of the wafer W is enhanced (step S105).

In addition, the area between the upper light irradiation unit G1 and the wafer W and the area between the lower light irradiation unit G2 and the wafer W can be kept in an inert gas atmosphere, for example, of nitrogen gas. As an example, by providing another nozzle to spray nitrogen gas with a certain flow rate toward upper and lower surfaces of the wafer W, the space around the wafer W can be kept in an inert gas atmosphere. By keeping the space around the wafer W in an inert gas atmosphere, ozone generation, due to the ultraviolet irradiation, can be prevented and light attenuation, due to the atmosphere, can also be prevented.

The above mentioned upper and lower light irradiation units G1 and G2 can be used concurrently with rinsing steps or drying steps and also can be used solely for processing wafers. Moreover, the light irradiation units are not necessarily placed both above and below the wafer W, but can be placed either above or below the wafer W.

While the preferred embodiments of the present invention have been described in detail, the invention is not limited to these specific embodiments. Various modifications and changes could be made without departing from the inventive scope, which is defined by the following claims.

Although in the embodiments, the apparatus for cleaning semiconductor wafers is used as an example, the invention can be applied for processing substrates, for example liquid crystal panels or the like, other than silicon wafers or compound wafers. In addition, details of the pot such as its shape, size, or material can be modified as appropriate without departing from the scope of the invention. Furthermore, the shape or number of the covers or the number of the collecting chambers also can be changed as appropriate.

The apparatus and method for processing substrates according to the present invention can be used for processing substrates and can be used particularly for processing substrates such as semiconductor wafers, for example, in cleaning steps.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A substrate processing apparatus comprising:
    a holding table for rotatably holding a substrate;
    a supply portion for supplying processing solution to said substrate;
    a pot for collecting the processing solution scattered from said substrate, wherein said pot is placed in the outer radius of said holding table; and
    at least one light irradiation unit for applying light to said substrate;
    wherein said pot comprises a ring-shaped inner circumference plate, a ring-shaped outer circumference plate, a tope plate, and a bottom plate coupling the inner circumference plate and the outer circumference plate, and at least one divider element which can be moved in the direction of the axis of said holding table, the tip of the inner circumference plate being at the nearly same height of the holding plane of the holding table, the divider element having an opening switch portion extending with a similar angle to the angle of the top plate and having a connection tip connected to the opening switch portion, and wherein at least first and second spaces for collecting processing solutions can be formed in the pot by changing the position of said at least one divider element,
    wherein when the divider element is placed at a first position, the first space for collecting processing solution is connected with the holding table by a ring-shaped first opening formed between the tip of the inner circumference plate and the opening switch portion which is abutted on the top plate, and the first space is connected with the second space for collecting processing solution through a second opening, the second opening formed between the connection tip of the divider and the bottom plate and placed at a position lower than the holding table,
    wherein when the divider element is placed at a second position, the opening switch portion is away from the top plate and is abutted on the tip of the inner circumference plate and the second opening is closed by connecting the connection tip to the bottom plate to shut the first space for collecting processing solution completely,
    the substrate processing apparatus further comprising first and second drainpipes connected to the first and second spaces for collecting processing solutions respectively and a single gas-solution separation portion connected to the outer second space for collecting processing solution.

2. The substrate processing apparatus of claim 1, wherein the first and second spaces for collecting processing solutions are placed concentrically with the holding table, and wherein the first space for collecting processing solution is placed inside of the second space for collecting processing solution, and wherein the gas-solution separation portion is connected to the second space for collecting processing solution.

3. The substrate processing apparatus of claim 2, wherein when the divider element is placed at the first position, a first processing solution is exhausted to the first drainpipe through the first opening and first space for collecting first processing solution, and wherein the atmosphere of the first processing solution is exhausted to the second drainpipe through the second opening and the second space for collecting processing solution for separating a gas and solution of the first processing solution.

4. The substrate processing apparatus of claim 1, wherein the gas-solution separation portion is connected to an exhaust utility.

5. The substrate processing apparatus of claim 1, wherein the first or second space for collecting processing solutions is kept under suction by a negative pressure.

6. A substrate processing apparatus comprising:
    a holding table for rotatably holding a substrate;
    a supply portion for supplying processing solution to said substrate;
    a pot for collecting the processing solution scattered from said substrate, wherein said pot is placed in the outer radius of said holding table, wherein said pot comprises a ring-shaped inner circumference plate, a ring-shaped outer circumference plate, a top plate, and a bottom plate coupling the inner circumference plate and the outer circumference plate, and at least one divider element which can be moved in the direction of the axis of said holding table, the tip of the inner circumference plate being at the nearly same height of the holding plane of the holding table, the divider element having an opening switch portion extending with a similar angle to the angle of the top plate and having a connection tip connected to the opening switch portion, and wherein at least first and second spaces for collecting processing solutions can be formed in the pot by changing the position of said at least one divider element;

first and second drainpipes connected to the first and second spaces for collecting processing solutions respectively; and a single gas-solution separation portion connected to either the first or second space for collecting processing solution;

wherein when the divider element is placed at a first position, the first space for collecting processing solution is connected with the holding table by a ring-shaped first opening formed between the tip of the inner circumference plate and the opening switch portion which is abutted on the top plate, and the first space is connected with the second space for collecting processing solution through a second opening, the second opening formed between the connection tip of the divider and the bottom plate and placed at a position lower than the holding table, and wherein when the divider element is placed at a second position, the opening switch portion is away from the top plate and is abutted on the tip of the inner circumference plate and the second opening is closed by connecting the connection tip to the bottom plate to shut the first space for collecting processing solution completely.

7. The substrate processing apparatus of claim 6, wherein the first and second spaces for collecting processing solutions are placed concentrically with the holding table, and wherein the first space for collecting processing solution is placed inside of the second space for collecting processing solution, and wherein the gas-solution separation portion is connected to the second space for collecting processing solution.

8. The substrate processing apparatus of claim 7, wherein when the divider element is placed at the first position, a first processing solution is exhausted to the first drainpipe through the first opening and first space for collecting the first processing solution, and wherein an atmosphere of the first processing solution is exhausted to the second drainpipe through the second opening and the second space for collecting processing solution for separating a gas and solution of the first processing solution.

9. The substrate processing apparatus of claim 6, wherein the gas-solution separation portion is connected to an exhaust utility.

10. The substrate processing apparatus of claim 6, wherein the first or second space for collecting processing solutions is kept under suction by a negative pressure.

11. A method of processing a substrate, the method comprising:
providing a substrate processing apparatus that comprises:
a holding table for rotatably holding a substrate;
a supply portion for supplying processing solution to said substrate;
a pot for collecting the processing solution scattered from said substrate, wherein said pot is placed in the outer radius of said holding table, wherein said pot comprises a ring-shaped inner circumference plate, a ring-shaped outer circumference plate, a top plate, and a bottom plate coupling the inner circumference plate and the outer circumference plate, and at least one divider element which can be moved in the direction of the axis of said holding table, the tip of the inner circumference plate being at the nearly same height of the holding plane of the holding table, the divider element having an opening switch portion extending with a similar angle to the angle of the top plate and having a connection tip connected to the opening switch portion, and wherein at least first and second spaces for collecting processing solutions can be formed in the pot by changing the position of said at least one divider element;

first and second drainpipes connected to the first and second spaces for collecting processing solutions respectively; and a single gas-solution separation portion connected to either the first or second space for collecting processing solution;

wherein when the divider element is placed at a first position, the first space for collecting processing solution is connected with the holding table by a ring-shaped first opening formed between the tip of the inner circumference plate and the opening switch portion which is abutted on the top plate, and the first space is connected with the second space for collecting processing solution through a second opening, the second opening formed between the connection tip of the divider and the bottom plate and placed at a position lower than the holding table, and wherein when the divider element is placed at a second position, the opening switch portion is away from the top plate and is abutted on the tip of the inner circumference plate and the second opening is closed by connecting the connection tip to the bottom plate to shut the first space for collecting processing solution completely securing a substrate on the holding table; and processing the substrate.

12. The method of claim 11, wherein processing the substrate comprises cleaning the substrate.

13. The method of claim 12, wherein processing the substrate comprises:
spraying a chemical solution onto the substrate;
rinsing the substrate; and
spin drying the substrate.

14. The method of claim 13, wherein processing the substrate further comprises:
applying ultraviolet rays onto the substrate while rinsing the substrate; and
irradiating the substrate with infrared rays while spin drying the substrate.

15. The method of claim 13, wherein the chemical solution comprises HF.

16. The method of claim 13, wherein the substrate comprises a semiconductor wafer.

17. The method of claim 11, wherein the substrate comprises a semiconductor wafer.

18. The method of claim 17, wherein processing the substrate comprises irradiating the substrate.

19. The method of claim 18, wherein processing the substrate comprises irradiating the substrate with ultraviolet rays.

20. The method of claim 18, wherein processing the substrate comprises irradiating the substrate with infrared rays.

* * * * *

UNITED STATES PATENT AND TRADEMARK OFFICE
CERTIFICATE OF CORRECTION

PATENT NO. : 7,467,635 B2
APPLICATION NO. : 10/842826
DATED : December 23, 2008
INVENTOR(S) : Satoshi et al.

It is certified that error appears in the above-identified patent and that said Letters Patent is hereby corrected as shown below:

In Col. 8, line 9, delete "hi" and insert --h1--.
In Col. 14, line 1, delete "tope" and insert --top--.

Signed and Sealed this

Tenth Day of March, 2009

JOHN DOLL
*Acting Director of the United States Patent and Trademark Office*